(12) United States Patent
Chang et al.

(10) Patent No.: US 6,429,108 B1
(45) Date of Patent: Aug. 6, 2002

(54) NON-VOLATILE MEMORY DEVICE WITH ENCAPSULATED TUNGSTEN GATE AND METHOD OF MAKING SAME

(75) Inventors: Chi Chang, Redwood City; Richard J. Huang, Cupertino, both of CA (US); Keizaburo Yoshie, Tokyo (JP); Yu Sun, Saratoga, CA (US)

(73) Assignees: Advanced Micro Devices, Inc., Sunnyvale, CA (US); Fujitsu Limited, Kawasaki (JP)

( * ) Notice: Subject to any disclaimer, the term of this patent is extended or adjusted under 35 U.S.C. 154(b) by 0 days.

(21) Appl. No.: 09/652,136

(22) Filed: Aug. 31, 2000

Related U.S. Application Data
(60) Provisional application No. 60/152,125, filed on Sep. 2, 1999.

(51) Int. Cl.[7] .......................................... H01L 21/3205
(52) U.S. Cl. ...................................................... 438/587
(58) Field of Search .................................. 438/593, 594, 438/595, 230, 303, 587, 588, 591

(56) References Cited

U.S. PATENT DOCUMENTS

| | | | |
|---|---|---|---|
| 5,077,691 A | 12/1991 | Haddad et al. | 365/218 |
| 5,470,773 A | 11/1995 | Liu et al. | 437/43 |
| 5,583,067 A * | 12/1996 | Sanchez | 437/44 |
| 6,159,835 A * | 12/2000 | Visokay et al. | 438/592 |
| 6,198,144 B1 * | 3/2001 | Pan et al. | 257/412 |
| 6,255,205 B1 * | 7/2001 | Sung | 438/595 |
| 6,288,419 B1 * | 9/2001 | Prall et al. | 257/213 |

* cited by examiner

*Primary Examiner*—David Nelms
*Assistant Examiner*—Quoc Hoang

(57) ABSTRACT

A tungsten gate MOS transistor and a memory cell useful in flash EEPROM devices are fabricated by encapsulating the tungsten gate electrode contact of each of the MOS transistor and floating gate memory cell with silicon nitride capping and sidewall layers, thereby preventing deleterious oxidation during subsequent processing at high temperature in an oxidizing ambient.

19 Claims, 2 Drawing Sheets

NON-VOLATILE MEMORY DEVICE WITH ENCAPSULATED TUNGSTEN GATE AND METHOD OF MAKING SAME

RELATED APPLICATIONS

This application claims priority from Provisional Application Ser. No. 60/152,125 filed on Sep. 2, 1999 entitled: "NON-VOLATILE MEMORY DEVICE WITH ENCAPSULATED TUNGSTEN GATE AND METHOD OF MAKING SAME", the entire disclosure of which is hereby incorporated by reference herein.

FIELD OF THE INVENTION

The present invention relates to a method of making a MOS transistor and a memory cell on a common semiconductor substrate and the device obtained thereby. The invention has particular utility in manufacturing high-density integration semiconductor memory devices, such as flash electrically erasable programmable read only memories (flash EEPROMS), with a design rule of 0.18 micron and under.

BACKGROUND OF THE INVENTION

The flash EEPROM is so named because the contents of all of the memory's array cells can be erased simultaneously at high speed. Flash EEPROMs, unlike floating gate EEPROMs which include a separate select transistor in each cell to provide for individual byte erasure, eliminate the select transistor and provide bulk erasure. As a consequence, flash EEPROM cells can be made much smaller than floating gate EEPROM cells fabricated under the same design rules, thus permitting formation of high density memories having easy erasability and reprogrammability.

Conventional flash EEPROMs typically comprise a floating gate memory cell, which includes a source region, a drain region, and a channel region formed in a semiconductor substrate, usually a silicon wafer, and a floating gate formed above the substrate and located between the channel region and a control gate. Most flash EEPROM cells use a "double-poly" structure, wherein an upper layer formed of, e.g., polysilicon and termed "poly 2", forms the control gate and a lower layer of polysilicon, termed "poly 1", forms the floating gate. The gate oxide layer is typically about 10 nm thick and the interpoly dielectric typically comprises a three layer composite of silicon oxide/silicon nitride/silicon oxide layers ("ONO") of total thickness of about 25 nm or less.

In operation, to program the memory cell, typically by Channel Hot Electron ("CHE") injection, a high voltage, such as about 10 volts, is applied to the control gate and a moderately high voltage, e.g., about 5 volts, is applied to the drain terminal while the source and substrate terminals are at ground potential. To erase the cell, either a Source Edge Erase ("SEE") or a Channel Erase ("CE") procedure can be utilized. According to the SEE procedure, a high negative voltage, such as −10 volts, is applied to the control gate and a moderately high voltage, e.g., about 5 volts, is applied to the source terminal while the drain potential floats. According to the CE procedure, a high negative voltage, such as −10 volts, is applied to the control gate and a moderately high voltage, e.g., about 7 volts, is applied to the device body (e.g., a well) while the source and drain potentials float. In either instance, a sufficiently large electric field is developed across the tunnel oxide and electrons can tunnel out from the floating gate either at the source terminal (SEE procedure) or through the channel region (CE procedure).

Flash EEPROM systems conventionally comprise a two-dimensional array of floating gate memory cells such as described above. The array typically includes several strings of floating gate memory transistors, each transistor being coupled to the neighboring transistor in the string by coupling the source of one device to the drain of the neighboring device, thereby forming bit lines. A plurality of word lines, perpendicular to the strings, each connect to the control gate of one memory cell of each string.

A CMOS transistor, referred to as a "row selector", is employed at one end of each word line to supply program voltage on demand to each of the word lines. The row selecting transistor and other transistors, e.g., for power supply purposes, are formed in the semiconductor wafer substrate concurrent with the formation of the memory cell array and typically employ much of the same processing steps and conditions. In some instances, the transistor, termed a "poly 2 periphery transistor" is formed on a peripheral portion of the semiconductor substrate and utilizes the "poly 2", or upper polysilicon layer used to form the control gates of the memory array cells.

In order to electrically contact the "poly 2" layer forming the gate electrode of. such peripheral transistors and the control gate electrode of the memory array cells, a layer of a refractory metal, e.g., titanium (Ti) or tungsten (W), is typically formed over the "poly 2" electrode (with or without interposition of adhesion and/or barrier layer(s)) and suitably patterned and annealed. The use of tungsten for forming such contacts is particularly attractive because tungsten—based polysilicon gate electrode contacts can be formed with sub-micron sized dimensions (D. Hisamoto et al., 1995 Symposium on VLSI Technology Digest of Technical Papers, pp 115–116), and with very low sheet resistance (i.e., 1.6–3 $\Omega/\square$) when either a titanium nitride (TiN) or tungsten nitride ($WN_x$) interlayer is provided between the tungsten layer and the polysilicon gate electrode layer (D. H. Lee et al., 1995 Symposium on VLSI Technology Digest of Technical Papers, pp 119–120; K. Kasai et al., IEDM 94, pp 497–500). However, a significant problem encountered with the use of tungsten as a gate electrode contact metal in memory array manufacture is oxidation thereof during high temperature (e.g., ~900° C.) furnace processing under an oxidizing ambient during MOS transistor and flash memory cell fabrication.

Thus, there exists a need for a process scheme, compatible with existing flash memory semiconductor manufacture, which allows formation of very low sheet resistance tungsten gate electrode contacts of deep submicron dimensions while reducing or eliminating oxidation thereof resulting from subsequent processing

DISCLOSURE OF THE INVENTION

An advantage of the present invention is a method of manufacturing a high-density flash memory array with an improved control gate electrode contact structure.

Another advantage of the present invention is a method of forming a flash memory array including a control gate electrode structure which is resistant to oxidation during high temperature processing in an oxidizing ambient.

Still another advantage of the present invention is a method of simultaneously forming oxidation resistant tungsten-based contacts to the gate electrode of a MOS transistor and the control gate electrode of a memory cell of a flash EEPROM.

A still further advantage of the present invention is a high density integration flash EEPROM semiconductor device having a tungsten-based gate electrode contact structure resistant to oxidation.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, which method comprises:

providing a semiconductor substrate comprising silicon and having a surface;

sequentially forming over the substrate a layer stack comprising:

a gate oxide layer (a) on the substrate surface, an electrically conductive polysilicon layer (b) on the gate oxide layer, a barrier material layer (c) on the polysilicon layer, a tungsten layer (d) on the barrier material layer, a silicon nitride layer (e) on the tungsten layer; and a polysilicon cap layer (f) on the silicon nitride layer;

selectively removing portions of layers (a)–(f) of the layer stack to define a pattern therein exposing sidewall surfaces of the layer stack;

forming at least one device region in the semiconductor substrate by implantation into the substrate surface, the layer stack serving as an implantation mask;

forming at least one oxide spacer layer (g) covering the uppermost and the exposed sidewall surfaces of the layer stack;

selectively removing at least a portion of the at least one oxide spacer layer (g) on the uppermost surface of the layer stack;

selectively forming a silicon nitride spacer layer (h) over the exposed surfaces of the at least one oxide spacer layer (g) covering the exposed sidewall surfaces of the layer stack, whereby the tungsten layer (d) is encapsulated by the combination of the silicon nitride layer (e) formed on the upper surface thereof and the silicon nitride spacer layer (h) formed over the at least one oxide spacer layer (g); and annealing the thus-formed layer stack at an elevated temperature in an oxidizing ambient, whereby the silicon nitride encapsulating layers (e) and (h) prevent oxidation of the tungsten layer (d) during the annealing.

According to another aspect of the present invention, the semiconductor device comprises a transistor, the layer stack is formed on at least a peripheral portion of the substrate surface, the electrically conductive polysilicon layer (b) comprises a gate electrode of the transistor, and the tungsten layer (d) comprises a gate electrode contact.

Another aspect of the present invention comprises, after forming gate oxide layer (a) but prior to forming polysilicon layer (b), the steps of:

forming an electrically conductive polysilicon layer (a') on the gate oxide layer (a); and forming an interpoly dielectric layer (a") on the polysilicon layer (a');

wherein the method further comprises the step of selectively removing portions of polysilicon layer (a') and interpoly dielectric layer (a") to thereby expose sidewall surfaces thereof in substantial vertical registry with the exposed sidewall surfaces of the layer stack; and the semiconductor device comprises a flash EEPROM, polysilicon layer (a') comprises a floating gate electrode, polysilicon electrode (b) comprises a control gate electrode, and tungsten layer (d) comprises a low sheet resistance control gate electrode contact.

In embodiments according to the present invention, polysilicon layer (b) corresponds to "poly 2", polysilicon layer (a') corresponds to "poly 1", the barrier material layer (c) comprises titanium nitride or tungsten nitride, the interpoly dielectric layer (a") comprises a silicon oxide/silicon nitride/silicon oxide ("ONO") composite, and the annealing comprises heating in a furnace in an oxygen containing ambient at a temperature of from about 800° C. to about 950° C. for from about 30 mins. to about 60 mins.

A still further aspect of the present invention is a semiconductor device comprising:

a semiconductor substrate comprising silicon and having a surface with at least one active device region formed therein or thereon;

a layer stack formed on the substrate surface over the at least one active device region, the layer stack comprising, in sequence:

a gate oxide layer (a) on the substrate, an electrically conductive polysilicon gate electrode layer (b) on the gate oxide layer, a titanium nitride or tungsten nitride barrier layer (c) on the polysilicon layer, a tungsten gate electrode contact layer (d) on the barrier layer, a silicon nitride layer (e) on the tungsten layer, and a polysilicon cap layer (f) on the tungsten layer, the layer stack patterned to expose sidewall surfaces of the layers of the layer stack;

at least one oxide spacer layer (g) covering the exposed sidewall surfaces of the layer stack; and a silicon nitride spacer layer (h) covering the exposed surfaces of the at least one oxide spacer layer (g), wherein the tungsten layer (d) is encapsulated by the combination of the silicon nitride layer (e) formed on the upper surface thereof and by the silicon nitride spacer layer (h) formed on the at least one oxide spacer layer (g), thereby preventing oxidation of tungsten layer (d) during annealing treatment at an elevated temperature in an oxidizing ambient.

According to an aspect of the present invention, the semiconductor device structure comprises a transistor and the at least one active device region is formed at least at a peripheral portion of the semiconductor substrate.

According to a further aspect of the present invention, the layer stack of the semiconductor device structure further comprises an electrically conductive polysilicon layer (a') (="poly 1") on the gate oxide layer (a) and a silicon oxide/silicon nitride/silicon oxide ("ONO") composite interpoly dielectric layer (a") on the polysilicon layer (a') and under polysilicon layer (b) (="poly 2"), polysilicon layer (a') and composite interpoly dielectric layer (a") patterned to expose sidewall surfaces thereof in substantial vertical registry with the sidewall surfaces of the layer stack, wherein the semiconductor device structure comprises a flash-type EEPROM, polysilicon layer (a') comprises a floating gate electrode, polysilicon layer (b) comprises a control gate electrode, and tungsten layer (d) comprises a control gate electrode contact.

Additional advantages of the present invention will become readily apparent to those skilled in the art from the following detailed description, wherein only the preferred embodiment of the present invention is shown and described, simply by way of illustration of the best mode contemplated for carrying out the method of the present invention. As will be realized, the invention is capable of other and different embodiments, and its several details are capable of modifications in various obvious respects, all without departing from the present invention. Accordingly, the drawing and description are to be regarded as illustrative in nature, and not as limitative.

It should be recognized that the various layers forming the layer stack or laminate illustrated in the appended drawings as representing portions of EEPROM structures and devices fabricated according to the inventive methodology are not drawn to scale, but instead are drawn as to best illustrate the features of the present invention.

DESCRIPTION OF THE INVENTION

Figure 1A:
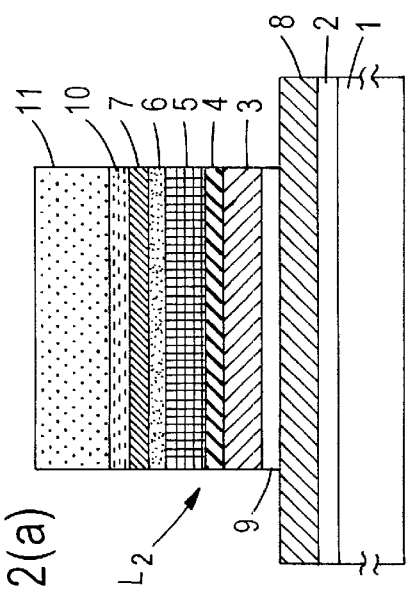
FIGS. 1(a)–1(f) and 2(a)–(f) are simplified, cross-sectional schematic diagrams illustrating process steps for forming "poly 2" peripheral transistor and stacked-gate memory cell portions, respectively, of a flash-type EEPROM device in accordance with the present invention.
Figure 2A:
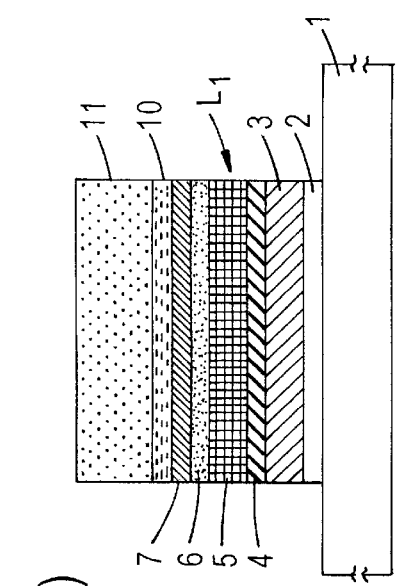

Referring to FIGS. 1(a) and 2(a), shown therein are layer stacks $L_1$ and $L_2$ respectively formed on peripheral and central portions of the silicon-based semiconductor substrate 1. Layer stack $L_1$ for forming the peripheral transistor comprises, in sequence, a gate oxide layer 2 on the upper surface of substrate 1, an electrically conductive polysilicon gate electrode layer 3 ("poly 2") on gate oxide layer 2, a barrier material layer 4 of titanium nitride (TiN) or tungsten nitride ($WN_x$) on polysilicon layer 3, a tungsten gate electrode contact layer 5 on barrier material layer 4, silicon nitride capping layer 6 on tungsten contact layer 5, and polysilicon "cap" layer 7 on silicon nitride layer 6. Layer stack $L_2$ for forming a memory cell comprises, in addition to the above described layers 2–7, a further electrically conductive polysilicon gate electrode layer 8 ("poly 1") formed on gate oxide layer 2 and an interpoly dielectric layer 9, typically a silicon oxide/silicon nitride/silicon oxide ("ONO") composite, formed on polysilicon layer 8 and below polysilicon layer 3 ("poly 2").

Layers 2–9 typically are formed utilizing conventional oxidative, reactive, physical vapor, and/or chemical vapor deposition techniques, and, hence, the details of which are not set forth herein in great detail. An embodiment of the present invention comprises a method for forming barrier material layer 4 using reactive sputtering of a titanium or tungsten target in a nitrogen ($N_2$) containing atmosphere. The use of a tungsten target advantageously enables the same target to be used, in sequence, for forming the overlying tungsten contact layer 5 by non-reactive sputtering. Tungsten contact layer 5 can also be formed by a chemical vapor deposition (CVD) process utilizing, e.g., tungsten hexafluoride ($WF_6$). Tungsten contacts obtained by such methods advantageously exhibit very low sheet resistance and can be formed with deep sub-micron dimensions.

After completion of formation of layer stacks $L_1$ and $L_2$, a bottom anti-reflection coating layer 10 ("BARC") is formed atop the uppermost polysilicon capping layer 7 of each layer stack, followed by formation thereon of a photoresist layer 11, in conventional manner. Photoresist layer 11 is then patterned as by conventional photolithographic tecniques, followed by etching of layer stacks $L_1$ and $L_2$ to expose sidewall surfaces of each of the constituent layers of the layer stacks (FIGS. 1(a) and 2(a)). Etching is performed in a conventional manner, as by anisotropic etching, e.g., reactive ion etching utilizing patterned photoresist layer 11 as an etch mask. In the MOS transistor region of the substrate (FIG. 1(a)), etching is performed down to the surface of substrate 1; whereas, in the memory cell region (FIG. 2(a)), polysilicon layer 8 ("poly 1") acts as an etch stop.

Figure 1B:
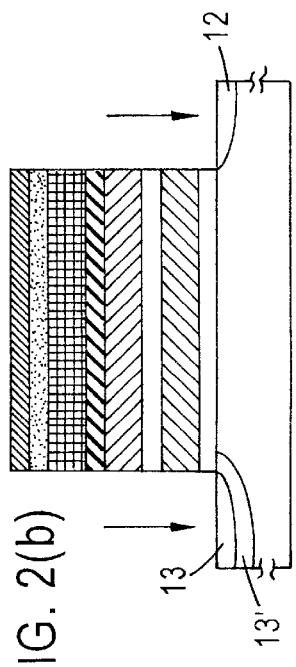
Figure 2B:
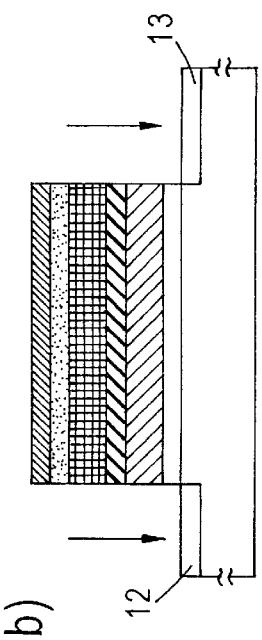

After removal of the photoresist layer 11 along with the underlying BARC layer 10, a series of light and medium dosage ion implantation steps are performed to create device regions of differing dopant density and profile, such as, but not limited to, source and drain regions 12 and 13 formed in the transistor region (FIG. 1(b)). As for the memory cell region, polysilicon layer 8 (="poly 1") is removed, as by anisotropic etching prior to implantating of source and drain n regions 12 and 13. Drain region 13' of the memory device also receives an $n^+$ implant, whereby the structure shown in FIG. 2(b) is obtained.

Figure 1C:
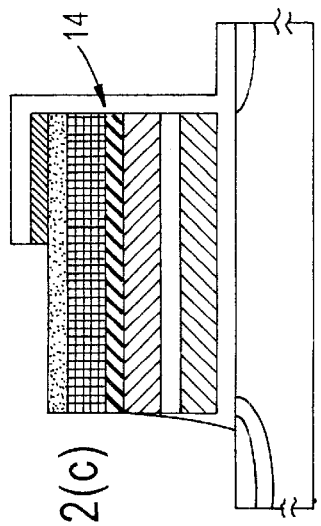
Figure 2C:
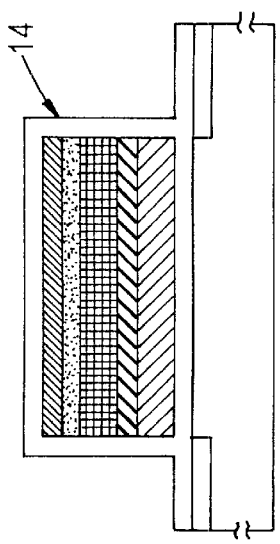

Next, and with reference to FIGS. 1(c) and 2(c), a first oxide spacer film or layer 14 having a width of from about 500 Å to about 3000 Å is deposited over the thus-patterned layer stacks and ion implanted source/drain regions to cover all exposed surfaces thereof. A portion of the oxide film 14 on the upper surface of layer stack $L_2$ of the memory cell is then removed, along with the underlying portion of polysilicon cap layer 7 and a portion of the first oxide spacer film 14 formed over a sidewall surface of the layer stack, as by an oxide etch, e.g., a "SAS" etch, having selectivity with respect to silicon nitride layer 6 and with respect to silicon.

Figure 1D:
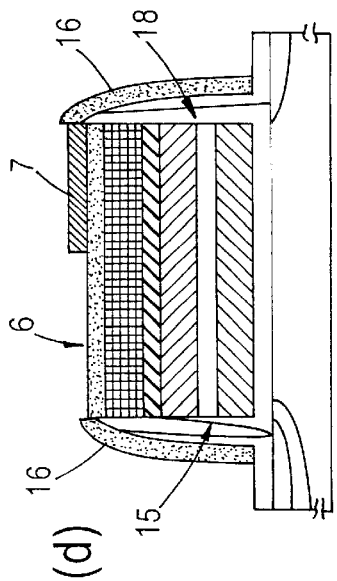
Figure 2D:
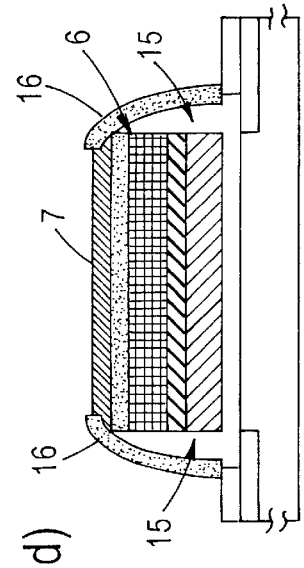

Referring now to FIGS. 1(d) and 2(d), a second oxide spacer layer having a width of from about 500 Å to about 3000 Å is formed over the upper and sidewall surfaces of the layer stacks and exposed surfaces of the substrate, e.g., over the source and drain regions, followed by selective etching of the oxide layer formed on the upper surfaces of the layer stacks and the substrate surfaces to form thicker oxide spacer layers on the sidewall surfaces of the layer stacks $L_1$ and $L_2$. A third oxide layer, having a width of about 300Å, is then formed over the second oxide layer and the substrate surfaces to complete formation of oxide spacer layers 15 having a width of from about 500 Å to about 3000Å. A silicon nitride film is then formed over the exposed surfaces and selectively etched, as by anisotropic etching, to form sidewall spacers 16 having a width of from about 500 Å to about 3000Å. The combination of silicon nitride capping layer 6 and sidewall spacers 16 serves to effectively seal or encapsulate tungsten gate electrode contact layer 5 and prevents deleterious oxidation thereof during subsequent high temperature treatment(s) in an oxidizing ambient, e.g., furnace annealing in an oxygen containing atmosphere. Given the guidance of the present disclosure, the widths and densities (alternatively, porosities) of both silicon nitride layers can easily be determined in a particular situation with due consideration of subsequent processing conditions to effectively preclude entry of oxidants (e.g., $O_2$) thereinto for reaction with tungsten contact layer 5.

Figure 1E:
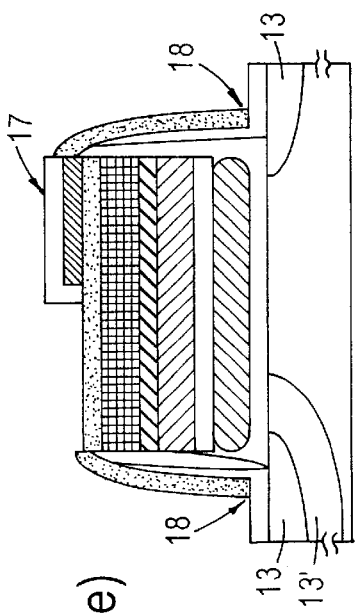
Figure 2E:
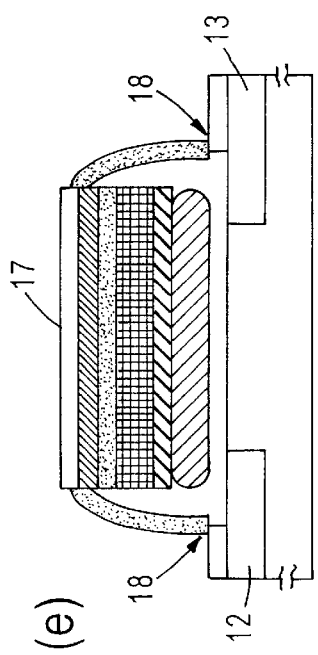

Referring now to FIGS. 1(e) and 2(e), the thus-formed structure is next subjected to high temperature furnace annealing in an oxidative (e.g., oxygen containing) atmosphere at a temperature of from about 800° C. to about 950° C., for from about 30 min. to about 60 min. Such high temperature annealing step serves, inter alia, to form the tungsten contact with low resistance, unify the various sub-layers constituting oxide sidewall spacer layer 15, oxidize the peripheral portions of the "poly 2" layer 3 of the transistor (FIG. 1(e)) and "poly 1" layer 8 of the memory cell (FIG. 2(e)), promote diffusion of the ion implanted dopants of source/drain regions 12, 13 further into semiconductor substrate 1, and form oxide layer 17 on the upper surface of each layer stack by oxidation of the uppermost surface of polysilicon "cap" layer 7. As may be seen from FIGS. 1(e) and 2(e), the thin oxide layer portion 18 at the lower corners of each of the layer stacks allows some oxygen diffusion thereinto during the annealing; however, tungsten gate electrode layer 5 is too distant from oxide layer portion 18 to react with any such diffused oxygen. As a consequence, oxidation of the tungsten gate electrode layer 5 during high temperature annealing in an oxidative ambient, or during any subsequent processing steps performed in an oxidative environment, is effectively prevented by forming silicon nitride layers 6 and 16 to "seal" the tungsten gate electrode layer. Additional advantages of the inventive method and sealing layer structure include full compatibility with the balance of processing steps and the ability to retain the silicon nitride sealing layers in place throughout processing.

Figure 1F:
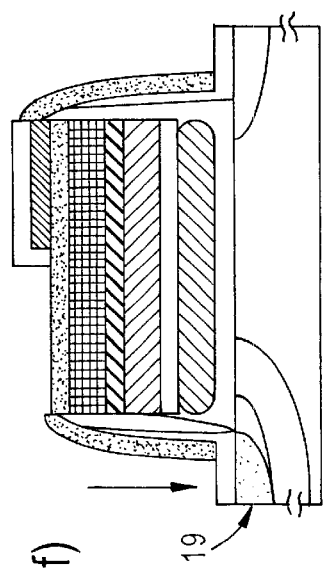
Figure 2F:
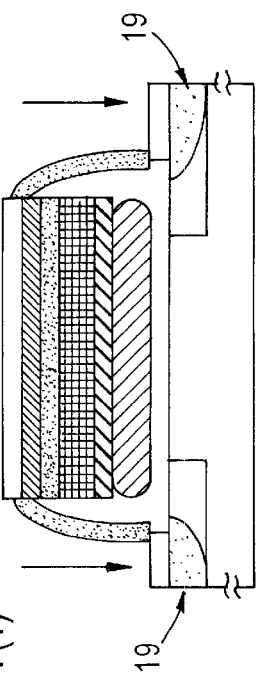

After completion of the high temperature furnace annealing, source/drain N$^+$ regions 19 and Vss connections are made by ion implantation (FIGS. 1(f) and 2(f)). Yet another advantage of the inventive process is that "re-oxidation" at the Si substrate 1 surface and at the corners of the "poly 1" and "poly 2" layers 8 and 3, respectively, permits Vss implantation without concern of contamination.

Thus, by the provision of silicon nitride layers according to the present invention which effectively encapsulates the tungsten gate electrode contact and remain in place throughout all processing steps involving high temperature treatment in oxidizing ambients, the problem of deleterious oxidation of the tungsten contacts is eliminated or substantially reduced, and deep sub-micron sized contacts having extremely low sheet resistance are reliably obtained. Moreover, although in the illustrated embodiment, the inventive concept is applied to the manufacture of flash EEPROMS, the method and structure of the present invention are applicable to any type of semiconductor device employing tungsten or tungsten-based contacts subjected to high temperature processing in an oxidizing ambient.

In the previous descriptions, numerous specific details are set forth, such as particular materials, structures, reactants, processes, etc., in order to provide a thorough understanding of the present invention. However, as one having ordinary skill in the art would recognize, the present invention can be practiced without resorting to the details specifically set forth. In other instances, well-known processing structures and techniques have not been described in detail in order not to unnecessarily obscure the present invention.

Only the preferred embodiments of the invention are shown and described herein. It is to be understood that the invention is capable of changes or modifications within the scope of the inventive concept as expressed herein.

What is claimed is:

1. A method of manufacturing a semiconductor device, which method comprises the steps of:
   providing a semiconductor substrate comprising silicon and having a surface;
   sequentially forming over said substrate surface a layer stack comprising:
   a gate oxide layer (a) on said substrate surface,
   an electrically conductive polysilicon layer (b) on said gate oxide layer,
   a barrier material layer (c) on said polysilicon layer,
   a tungsten layer (d) on said barrier material layer,
   a silicon nitride layer (e) on said tungsten layer; and
   a polysilicon cap layer (f) on said silicon nitride layer;
   selectively removing portions of layers (a)–(f) of said layer stack to define a pattern therein exposing sidewall surfaces of said layer stack;
   forming at least one device region in said semiconductor substrate by ion implantation into said substrate surface, said layer stack serving as an implantation mask;
   forming at least one oxide spacer layer (g) covering the exposed surfaces of said layer stack;
   selectively removing at least a portion of the at least one oxide spacer layer (g) on the uppermost surface of said layer stack;
   selectively forming a silicon nitride spacer layer (h) over the exposed surfaces of the at least one oxide spacer layer (g) covering the exposed sidewall surfaces of said layer stack, whereby said tungsten layer (d) is encapsulated by the combination of said silicon nitride layer (e) formed on the upper surface thereof and said silicon nitride spacer layer (h) formed over said at least one oxide spacer layer (g); and
   annealing the thus-formed layer stack at an elevated temperature in an oxidizing ambient, whereby said silicon nitride encapsulating layers (e) and (h) prevent oxidation of said tungsten layer (d) during said annealing.

2. The method as in claim 1, wherein said semiconductor device comprises a transistor, the method comprising:
   forming said layer stack on at least a peripheral portion of said substrate surface; and
   forming source and drain regions; wherein said electrically conductive polysilicon layer (b) comprises a gate electrode of said transistor, and said tungsten layer (d) comprises a gate electrode contact.

3. The method as in claim 2, further comprising:
   forming said layer stack on a central portion of said substrate surface, and, after forming gate oxide layer (a) but prior to forming polysilicon layer (b), forming an electrically conductive polysilicon layer (a') on said gate oxide layer (a);
   forming an interpoly dielectric layer (a") on said polysilicon layer (a'); and
   removing portions of polysilicon layer (a') and interpoly dielectric layer (a") to thereby expose sidewall surfaces thereof in substantial vertical registry with said exposed sidewall surfaces of said layer stack; wherein said semiconductor device comprises a flash-type EEPROM, said polysilicon layer (a') comprises a floating gate electrode, said polysilicon layer (b) comprises a low sheet resistance control gate electrode, and said tungsten layer (d) comprises a control gate electrode contact.

4. The method as in claim 3, comprising annealing in an oxygen containing ambient at a temperature of from about 800° C. to about 950° C. for about 30 min. to about 60 min.

5. The method as in claim 3, comprising forming said gate oxide layer (a) at a thickness of from about 70 Å to about 200 Å.

6. The method as in claim 3, comprising forming said electrically conductive polysilicon layer (a') at a thickness of from about 900 Å to about 2500 Å.

7. The method as in claim 3, comprising forming said interpoly dielectric layer (a") at a thickness of from about 30 Å to about 250 Å.

8. The method as in claim 7, wherein said interpoly dielectric layer (a") comprises a silicon oxide/silicon nitride/silicon oxide composite.

9. The method as in claim 3, comprising forming said electrically conductive polysilicon layer (b) at a thickness of from about 900 Å to about 2500 Å.

10. The method as in claim 3, comprising forming said layer (c) of barrier material at a thickness of from about 100 Å to about 1500 Å.

11. The method as in claim 10, comprising depositing said barrier layer (c) of tungsten nitride by reactive sputtering of a tungsten target in a nitrogen-containing atmosphere.

12. The method as in claim 10, comprising depositing said barrier layer (c) of titanium nitride by reactive sputtering of a titanium target in a nitrogen-containing atmosphere.

13. The method as in claim 3, comprising forming said layer (d) of tungsten at a thickness of from about 2000 Å to about 4000 Å by a physical or chemical vapor deposition process.

14. The method as in claim 3, comprising forming said layer (e) of silicon nitride on the upper surface of tungsten layer (d) at a thickness of from about 300 Å to about 1000 Å.

15. The method as in claim 3, comprising forming said polysilicon cap layer (f) at a thickness of from about 500 Å to about 3000 Å.

16. The method as in claim 15, further comprising selectively removing a portion of said polysilicon cap layer (f) and forming an oxide layer over the remaining portion thereof.

17. The method as in claim 3, comprising forming said at least one oxide spacer layer (g) covering the exposed sidewall surfaces of said layer stack at a thickness of from about 500 Å to about 3000 Å.

18. The method as in claim 3, comprising forming said silicon nitride spacer layer (h) covering the exposed surfaces of said at least one oxide spacer layer (g) at a thickness of from about 500 Å to about 3000 Å.

19. The method as in claim 3, further comprising selectively forming $n^+$ contact and Vss connecting implant regions in said semiconductor substrate.

* * * * *